US008330333B2

(12) United States Patent
Harhen et al.

(10) Patent No.: US 8,330,333 B2
(45) Date of Patent: Dec. 11, 2012

(54) ULTRASOUND IMAGING TRANSDUCER ACOUSTIC STACK WITH INTEGRAL ELECTRICAL CONNECTIONS

(75) Inventors: Edward Paul Harhen, Duxbury, MA (US); Mitchell Thompson, Exton, PA (US)

(73) Assignee: Imacor Inc., Garden City, NY (US)

( * ) Notice: Subject to any disclaimer, the term of this patent is extended or adjusted under 35 U.S.C. 154(b) by 0 days.

(21) Appl. No.: 12/845,480

(22) Filed: Jul. 28, 2010

(65) Prior Publication Data
US 2011/0025172 A1 Feb. 3, 2011

Related U.S. Application Data

(60) Provisional application No. 61/229,480, filed on Jul. 29, 2009.

(51) Int. Cl.
*H01L 41/09* (2006.01)
*A61B 8/00* (2006.01)

(52) U.S. Cl. ........ 310/334; 310/322; 310/326; 310/327; 600/459

(58) Field of Classification Search ............. 310/316.01, 310/322, 326, 327, 334; 600/459
See application file for complete search history.

(56) References Cited

U.S. PATENT DOCUMENTS

| | | | |
|---|---|---|---|
| 4,747,192 A * | 5/1988 | Rokurota | 29/25.35 |
| 4,825,115 A * | 4/1989 | Kawabe et al. | 310/327 |
| 5,730,113 A * | 3/1998 | Wildes et al. | 125/13.01 |
| 5,795,299 A | 8/1998 | Eaton et al. | |
| 5,798,461 A * | 8/1998 | Banta et al. | 73/625 |
| 5,945,770 A * | 8/1999 | Hanafy | 310/322 |
| 6,894,425 B1 | 5/2005 | Solomon et al. | |
| 2003/0018265 A1* | 1/2003 | Tahara | 600/459 |
| 2004/0054289 A1* | 3/2004 | Eberle et al. | 600/459 |
| 2004/0095045 A1* | 5/2004 | Baumgartner | 310/365 |
| 2004/0100163 A1* | 5/2004 | Baumgartner et al. | 310/334 |
| 2008/0130415 A1* | 6/2008 | Tai | 367/140 |
| 2008/0303381 A1* | 12/2008 | Yuuya et al. | 310/327 |
| 2008/0312537 A1* | 12/2008 | Hyuga | 600/459 |
| 2010/0176688 A1* | 7/2010 | Jin et al. | 310/327 |
| 2010/0241003 A1* | 9/2010 | Jung et al. | 600/459 |

FOREIGN PATENT DOCUMENTS

| | | | |
|---|---|---|---|
| EP | 0426099 A2 * | 5/1991 | |
| EP | 0559963 A2 * | 9/1993 | |
| EP | 0671221 | 9/1995 | |
| EP | 0671221 A2 * | 9/1995 | |
| WO | 2006018805 | 2/2006 | |

OTHER PUBLICATIONS

Search Report and Written Opinion from corresponding application PCT/US2010/043565.

\* cited by examiner

*Primary Examiner* — Thomas Dougherty
(74) *Attorney, Agent, or Firm* — Proskauer

(57) ABSTRACT

An ultrasound transducer that includes a backing layer, an insulating layer disposed on top of the backing layer, and a plurality of conductive traces disposed on top of the insulating layer are disclosed. Each of the conductive traces has an upper face. A plurality of transducer elements, each having (a) a core of piezoelectric material and (b) a conductive coating disposed beneath the core, are bonded directly to the upper face of a respective one of the plurality of conductive traces. Methods for fabricating ultrasound transducers are also disclosed.

13 Claims, 3 Drawing Sheets

ULTRASOUND IMAGING TRANSDUCER ACOUSTIC STACK WITH INTEGRAL ELECTRICAL CONNECTIONS

CROSS REFERENCE TO RELATED APPLICATIONS

This Application claims the benefit of U.S. Provisional Application 61/229,480, filed Jul. 29, 2009, which is incorporated herein by reference.

BACKGROUND

Transesophageal echocardiography (TEE) is an ultrasound imaging technique that provides images of the heart for diagnostic and/or monitoring purposes. One particularly beneficial use of TEE is for obtaining images of the transgastric short axis view (TGSAV) of the left ventricle (LV). This is particularly useful for managing the cardiac function of patients in several hospital settings including the Intensive Care Unit and the Post Operative Setting. Small TEE probes that can be used over an extended period of time are particularly useful in this difficult patient population, as described in application Ser. No. 10/996,816, which us incorporated herein by reference as if set forth in its entirety.

Manufactures of conventional TEE ultrasound transducers typically strive to acoustically isolate the electrical connections to the piezo-electric components from the piezo materials and the associated backing and matching layers (also known as the acoustic stack). This isolation is desirable due to the deleterious effect that the materials typically employed have on the tuning of the acoustic stack. Some conventional approaches for making the electrical connection while maintaining acoustic isolation include special edge bonding, wire bonding, special ceramic fingers, and other high cost, high precision methods. Other approaches include using very fine wire attachments that go through the backing layers, aligned so that they are effectively in between the elements, where they do not affect the acoustic stack. Unfortunately, all these approaches for making the electrical connection are relatively difficult and/or expensive.

BRIEF SUMMARY OF THE INVENTION

One aspect of the invention relates to an ultrasound transducer that includes a backing layer, an insulating layer disposed on top of the backing layer, and a plurality of conductive traces disposed on top of the insulating layer. Each of the conductive traces has an upper face. A plurality of transducer elements, each having (a) a core of piezoelectric material and (b) a conductive coating disposed beneath the core, are bonded directly to the upper face of a respective one of the plurality of conductive traces. Preferably, a matching layer is disposed on top of the plurality of transducer elements.

Another aspect of the invention relates to a method of fabricating an ultrasound transducer. This method includes the steps of bonding a block of piezoelectric material having a conductive coating to a flex circuit having (a) a first conductive region disposed on an insulating substrate and (b) at least 20 conductive traces that are disposed on the insulating substrate and are in electrical contact with the first conductive region, so that the block bonds to the first conductive region. The block is then diced into at least 20 transducer elements. The dicing step is controlled so as to cut all the way through the block and all the way through the first conductive region, and part way through, but not completely through, the insulating substrate, and the dicing is performed at positions that are aligned with respect to the conductive traces so that after the dicing step is implemented, (a) the first conductive region is divided into at least 20 regions that are electrically isolated from each other, and (b) each of the at least 20 regions is in electrical contact with a respective one of the at least 20 conductive traces.

Another aspect of the invention relates to a method of fabricating an ultrasound transducer. This method includes the steps of bonding a block of piezoelectric material having a conductive coating to a flex circuit having at least 20 parallel conductive traces disposed on an insulating substrate, so that the block bonds with a distal end of the at least 20 conductive traces. The block is then diced into at least 20 transducer elements. The dicing is controlled so as to cut all the way through the block and part way through, but not completely through, the insulating substrate. The dicing is performed at positions that are aligned with respect to the conductive traces so that after the dicing step is implemented, the at least 20 transducer elements are electrically isolated from each other, with each of the at least 20 transducer elements bonded to a respective one of the at least 20 conductive traces.

DESCRIPTION OF THE PREFERRED EMBODIMENTS

Figure 1:
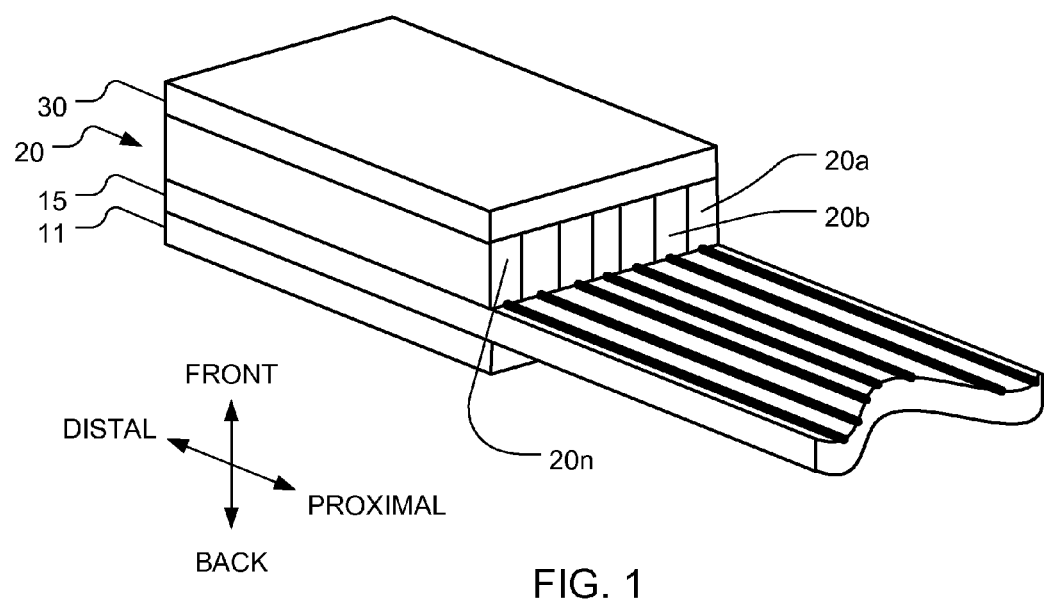
FIG. 1 is a perspective view of the layers that form the acoustic stack in an embodiment of the invention.

FIG. 1 depicts a first preferred embodiment of the invention in which the electrical interface is specifically included as part of the backing section of the tuned acoustic stack structure. This structure of this embodiment can be divided into four groups. Beginning with the back (also referred to herein as the bottom), those groups are: a backing substrate 11, a flex circuit 15, a piezoelectric section 20, and finally a matching layer 30 in front (also referred to herein as the top). Note that while FIG. 1 shows a schematic representation of seven elements 20a . . . 20n in the piezoelectric section 20, a larger number of elements (e.g., between 20 and 80) is preferred. For example, some preferred sizes for TEE applications include between 24 and 40 elements for use in miniature probes, and between 60 and 70 elements for use in full size probes. Note also that the figures in this application are not drawn to scale.

Figure 2:
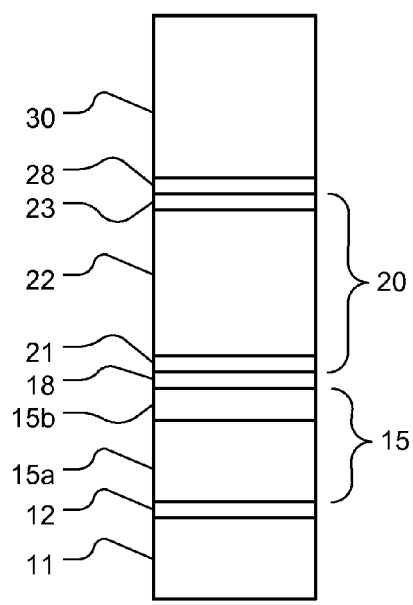
FIG. 2 is a more detailed view of the layers that form the acoustic stack structure in the FIG. 1 embodiment.

FIG. 2 shows more details of the FIG. 1 embodiment. The back layer is the backing substrate 11, which can be made of any material that is an effective acoustic absorber in the frequency range of interest, e.g., from 4.5 to 7.5 MHz. An epoxy/tungsten matrix is one suitable material. Others suitable materials include tuned structures of high and low acoustic impedance materials that can be configured to be absorbers by destructive interference within the desired frequency range. These materials are preferably chosen to minimize any negative effects due to this construction method (e.g., regions of poor sensitivity within the desired frequency range, excessive heating due to poor thermal heat transfer, or being difficult to manufacture). The thickness of the backing substrate 11 is not critical as long as unwanted components of ultrasound energy are not reflected back into the PZT.

A flex circuit 15 is mounted on the backing substrate 11. The flex circuit 15 has an insulating layer 15a in the back and a conductive layer 15b in front. Preferably, the insulating layer 15a is made of polyimide, or another material that is monolithic, flexible, has uniform thickness, and is easy to use in conventional, well-understood manufacturing processes. Preferably, the conductive layer 15b insulating is made of copper or another suitable metal that is monolithic, has uniform thickness, and may be further processed with conventional, well-understood manufacturing processes. In less preferred embodiments, a non-metallic conductive layer may be used instead of copper. Mounting of the flex circuit 15 onto the backing substrate 11 may be done using a suitable adhesive 12 like EPO-TEK® 301, by applying an epoxy-based backing in liquid form directly onto the polyimide, and letting it cure.

The thickness of the copper and polyimide utilized in the construction of the flex circuit are chosen to either (a) have minimal impact on the rest of the resonant structure, in which case they are made as thin as practical, or (b) the thicknesses are chosen as to allow transmission of the ultrasound into a backing structure which incorporates the flex circuit as the initial layers of said backing structure. The former approach has been utilized in some preferred embodiments by (1) keeping the thickness of both the polyimide and the copper well below ¼ wavelength at the frequency of interest, (2) making the copper thick enough to have a low resistance, and (3) making the polyimide thick enough to facilitate manufacturability of the flex circuits on conventional equipment using conventional processes. A 25 µm layer of polyimide and a 17.5 µm layer of copper have been found to work well.

After the flex circuit 15 is mounted on the backing substrate 11, the mounted portion of the insulating layer 15a is substantially flat and the conductive layer 15b remains exposed on the front face of the flex circuit 15. The piezoelectric section 20 is then bonded directly to the exposed conductive layer 15b using, for example, a conductive adhesive 18 such as Tracon Silver epoxy. Very low melting point solders available from Indium Corporation may also be used to bond the piezoelectric section 20 to the conductive layer 15b by placing the solder between the layers in foil or paste form, then melting the solder to form a joint. When a conductive bonding method is used, an electrical interface between the conductive layer 15b of the flex circuit 15 and the piezoelectric section 20 is established by conduction. Alternatively, the piezoelectric section 20 may be bonded directly to the exposed conductive layer 15b using an epoxy adhesive like EPO-TEK® 301, or another suitable insulating adhesive. When an insulating adhesive is used, an electrical interface between the conductive layer 15b of the flex circuit 15 and the piezoelectric section 20 is established by capacitive coupling.

The piezoelectric section 20 is preferable made from a PZT material 22 that has been coated on the front and back with layers 23, 21 of a conductive material like silver or gold. In alternative embodiments, one or both of those layers can be omitted, in which case appropriate modifications to the construction may be required (e.g., using a different adhesive 18), as will be appreciated by persons skilled in the relevant arts.

Figure 3A:
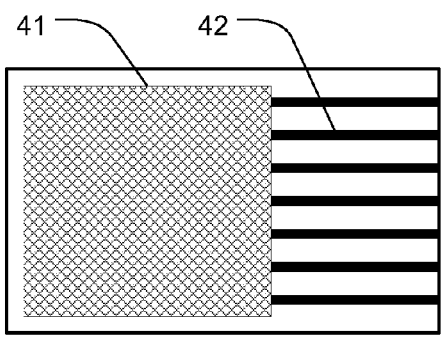
FIG. 3A is an initial configuration of a flex circuit that can be used to form the acoustic stack structure shown in FIG. 1.

A number of alternative approaches may be used for the next step in the fabrication process. In one embodiment, the piezoelectric section 20 starts out as a block of material (i.e., it is not pre-diced into individual elements). The portion of the flex circuit 15 that goes beneath the piezoelectric section 20 initially starts out as a continuous region of copper, and the portion of the flex circuit that is not beneath the piezoelectric section 20 has a plurality of conductive traces that terminate at that continuous region of copper. This initial configuration for the flex circuit 15 is shown in FIG. 3A, with the continuous region of copper 41 and the traces 42.

Figure 3B:
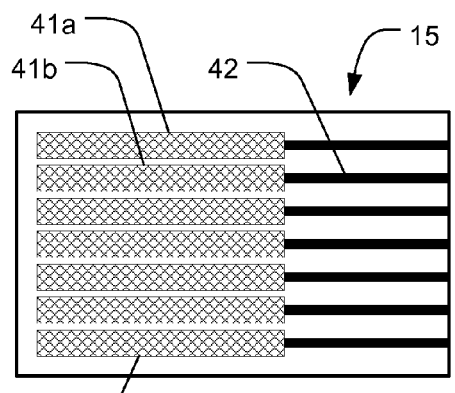
FIG. 3B is a final configuration for the flex circuit of FIG. 3A.

Returning to FIGS. 1 and 2, after the piezoelectric section 20 is bonded to the continuous region of copper, the piezoelectric section 20 is diced into individual elements using a dicing saw. The depth of the dicing is accurately controlled so as to (a) cut through the whole piezoelectric section 20, and (b) also cut through the whole conductive layer 15b, but not deep enough to cut completely through the rear insulating layer 15a of the flex circuit 15. This forms an array of individual PZT elements 20a . . . 20n, each of which is electrically interfaced to its own individual, electrically isolated, section of the flex circuit 41a . . . 41n (as shown in FIG. 3B). The cuts are preferably parallel to the conductive traces at a pitch that matches the pitch of the conductive traces, with the cuts aligned so that each of these newly divided individual sections of the flex circuit 41a . . . 41n lines up with one of the conductive traces 42, resulting in an electrical connection (i.e., a trace on the flex circuit 15) for each individual PZT element 20a . . . 20n (shown in FIG. 1).

Figure 4:
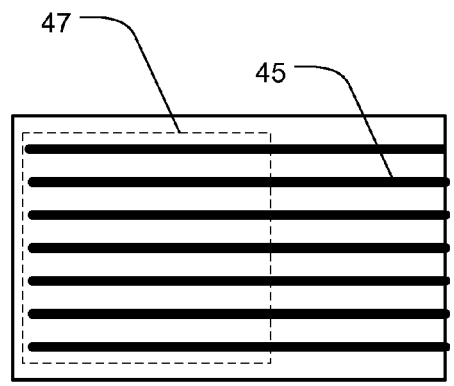
FIG. 4 is another initial configuration of a flex circuit that can be used to form the acoustic stack structure shown in FIG. 1.

In a second embodiment, the piezoelectric section 20 starts out as a block of material (i.e., it is not pre-diced into individual elements), but the portion of the flex circuit 15 that goes beneath the piezoelectric section 20 starts out pre-divided, in the form of a plurality of traces that extend out to the portion of the flex circuit that is not beneath the piezoelectric section 20. This configuration for the flex circuit 15 is shown in FIG. 4, with the plurality of traces 45. The piezoelectric section 20 is bonded to the distal end of the traces, in the region indicated by dashed line 47. Returning to FIGS. 1 and 2, after the bonding, the piezoelectric section 20 is diced into individual elements using a dicing saw. In this embodiment, the depth of the dicing is accurately controlled to cut through the whole piezoelectric section 20, but not deep enough to cut completely through the rear insulating layer 15a of the flex circuit 15. This results in a plurality if individual PZT elements 20a . . . 20n, each of which is electrically interfaced to its own trace on the flex circuit. The cuts are preferably parallel to the conductive traces at a pitch that matches the pitch of the conductive traces, with the cuts aligned so that the cuts will lie between the traces 45 (shown in FIG. 4). This results in an electrical connection (i.e., a trace on the flex circuit 15) for each PZT element.

In a third embodiment, the piezoelectric section 20 starts out pre-diced into individual elements 20a . . . 20n, and the portion of the flex circuit 15 that goes beneath the piezoelectric section 20 also starts out pre-divided, as shown in FIG. 4. The piezoelectric section 20 (shown in FIG. 1) is bonded to the distal end of the traces, in the region indicated by dashed line 47 in FIG. 4, taking care to align the individual elements 20a . . . 20n of the piezoelectric section 20 with the traces on the flex circuit 15. This also results in a plurality of individual PZT elements 20a . . . 20n, each of which is electrically interfaced to its own trace on the flex circuit.

Note that in the above-described embodiments, when a conductive bonding method between piezoelectric section 20 and the conductive layer 15b of the flex circuit 15 is used, the electrical interface between each trace and the corresponding transducer element is a conductive interface. In this situation, an electrical signal that is applied to a given conductive trace will travel along the trace, cross the conductive bonding material via conduction, and arrive at the corresponding transducer element. Similarly, return signals that are generated by each transducer element will travel across the conductive bonding material by conduction, and arrive at the corresponding conductive trace. When an insulating bonding method between piezoelectric section 20 the conductive layer 15b of the flex circuit 15 is used, the electrical interface between each trace and the corresponding transducer element is a capacitive coupling interface. In this situation, an AC electrical signal that is applied to a given conductive trace will travel along the trace, travel across the insulating bonding material by capacitive coupling, and arrive at the corresponding transducer element. Similarly, return signals that are generated by each transducer element will travel across the insulating bonding material by capacitive coupling, and arrive at the corresponding conductive trace.

A ground plane may be implemented by using the conductive layer 23 on the front face of the piezoelectric section 20. Since the conductive layer 23 is divided into strips, an electrical connection is preferably made between those strips. In some preferred embodiments, the transducer elements at either lateral side (i.e., elements 20a and 20n shown in FIG. 1) are guard elements that do not transmit ultrasound. In these embodiments, the conductive traces in the flex circuit 15 below those elements are available to make a connection to the ground plane. One suitable way to make the electrical connection between the traces beneath the side elements and the conductive strips on the front face of the piezoelectric section 20 is with a conductive epoxy (e.g., silver epoxy), which may be applied at either the distal wall or the proximal wall of the piezoelectric section 20.

After the piezoelectric section 20 is added as described above, a material that supports the PZT elements mechanically but does not transfer ultrasound between the elements with any degree of effectiveness is preferably backfilled into the gaps between the elements. Examples of suitable materials include silicone and polyurethane. Next, a matching layer 30 is mounted on top of the piezoelectric section 20 using a wide range of adhesives 28 such as epoxies, pressure sensitive adhesives, multi-part silicones, urethanes, or another adhesive that will not damage the transducer as built up to this point. In alternative embodiments, the matching layer 30 may be applied as a liquid and cured (e.g., using UV light).

In alternative embodiments, the matching layer 30 may be mounted on top of the piezoelectric section 20 prior to dicing, in which case the dicing and backfilling steps would be performed after the step of mounting the matching layer 30 on the piezoelectric section 20.

Figure 3C:
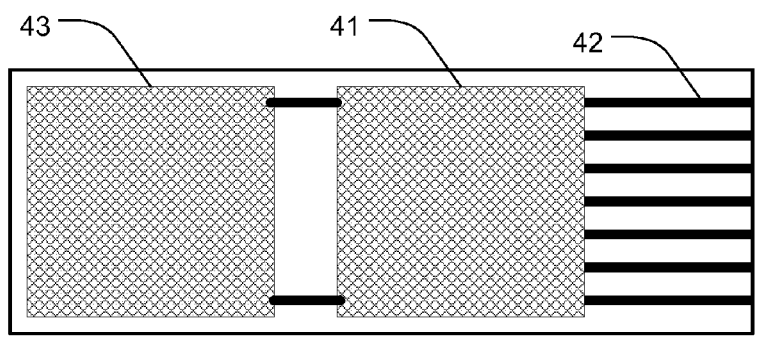
FIG. 3C is an initial configuration of the flex circuit of FIG. 3A, with an extra patch that is used to form a ground plane.

Alternative ways to implement a ground plane on the front of the piezoelectric section 20 may be used. One way is to mount a piece of conductive foil on top of the piezoelectric section 20. Another way is to implement the ground plane using the same flex circuit 15 that sits beneath the piezoelectric section 20. This may be accomplished by using a large conductive patch 43 that starts out positioned laterally offset with respect to the patch 41, as shown in FIG. 3C. After the piezoelectric section 20 is mounted on top of the patch 41 and diced into individual elements as discussed above, the large conductive patch 43 is then folded up and then over the front face of the piezoelectric section 20 to form a roof that serves as the ground plane.

Figure 5A:
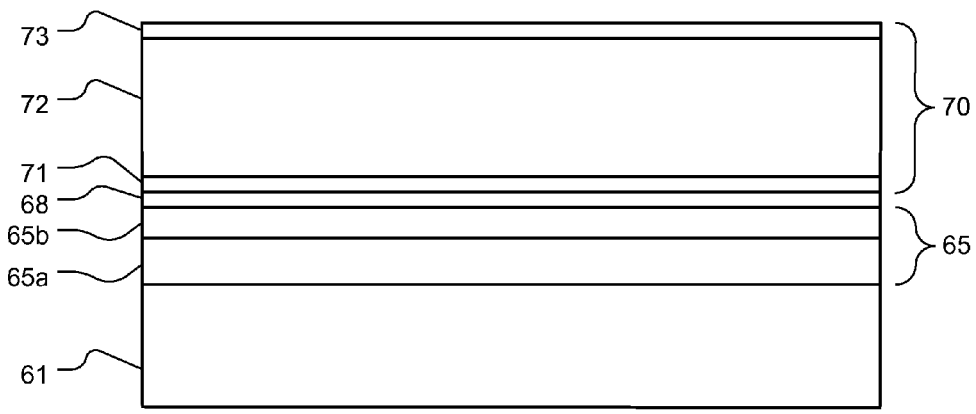
FIG. 5A is a cross section of another embodiment of an acoustic stack in the middle of the manufacturing process.
Figure 5B:
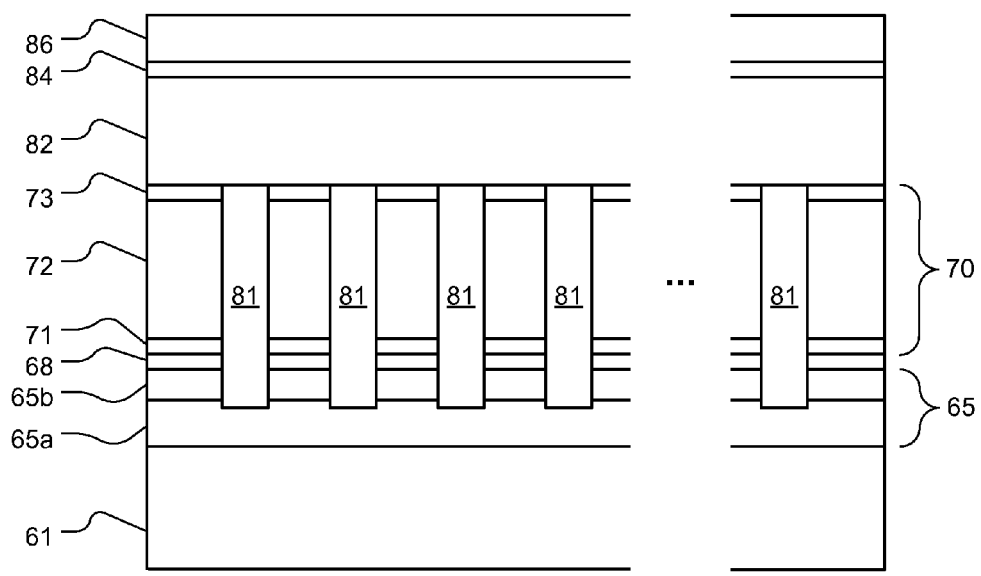
FIG. 5B is a cross section of the FIG. 5A embodiment after it has been completed.

FIGS. 5A and 5B depict another preferred embodiment of an acoustic stack. More specifically, FIG. 5A is a cross section of this embodiment in the middle of the manufacturing process, and FIG. 5B is a cross section of this embodiment after it has been completed. Starting with FIG. 5A, the lowermost layer 61 is the backing layer made of a tungsten filled epoxy mixed to produce a matrix of Acoustic Impedance of 2.7 MRayls, greater than 840 μm thick. A flex circuit 65 is mounted on top of the backing layer. The flex circuit has a lower layer 65a of polyimide 25 μm thick, with a ½ ounce layer 65b of copper (i.e., a 17.5 μm layer of Cu) disposed on top of the polyimide layer 65a. One suitable way to attach the backing layer 61 to the polyimide layer 65a of the flex circuit 65 is to flip the flex circuit upside down so the polyimide layer 65a is on top, apply the epoxy in liquid form on top of the polyimide, wait for it to cure, grind the epoxy backing layer 61 down to the desired thickness, and then flip everything over so the flex circuit is right side up.

A piezoelectric block 70 made of a 280 μm thick piece of PZT-5H 72 with silver electrodes 71, 73 coated on both its front and rear face is then bonded directly to top of the copper side of the flex circuit 65, using a thin layer 68 (preferably less than 10 μm thick) of EPO-TEK® 301 epoxy adhesive (made by Epoxy Technology, Inc.) or an suitable alternative like Spurrs epoxy. Preferably, the bonding material 68 is so thin that its impact on the acoustic characteristics of the stack becomes negligible. In alternative embodiments, different thicknesses for the piezoelectric block may be used, e.g., between 150 and 400 μm.

Turning now to FIG. 5B, the piezoelectric block 70 is then diced as described above, so that the dicing cuts all the way through the piezoelectric block and part way through, but not all the way through, the insulating layer 65a of the flex circuit 65. For example, the transducer may be divided into 32 active elements, spaced at a pitch of 140 micrometers. Of course, a different number of active elements may be used, as explained above. Different dicing pitches may also be used (e.g., pitches between 100 and 200 μm), depending on the desired operating frequency. After dicing, the spaces between the elements of the transducer are preferably filled in with a soft elastomer material 81 (e.g., silicone).

A matching layer is then disposed on top of the piezoelectric block 70. One suitable matching layer consists of (from the bottom to the top): A layer 82 of Alumina filled epoxy mixed to produce a matrix with Acoustic Impedance of 5.0 MRayls, 75-80 μm thick; a layer 84 of EPO-TEK® 301 adhesive, preferably less than 10 μm thick; and a layer 86 of polyurethane 100-105 μm thick, of Acoustic Impedance 1.9 MRayls.

Note that it may be possible to change the assembly steps in this embodiment, and still end up with the same acoustic stack. Various substitutions may also be made to arrive at similar configurations, or at alternative configurations that will perform well enough to function in the intended application.

The techniques described above make it possible to make the electrical interface to the individual elements in ultrasound transducers, and provide high performance at a significantly lower cost as compared to conventional techniques.

While the present invention has been disclosed with reference to certain embodiments, numerous modifications, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An ultrasound transducer comprising:
   a layer of insulating material, the layer having an upper face;
   a backing layer disposed beneath the layer of insulating material;
   a plurality of conductive traces disposed on the upper face of the layer of insulating material, each of the conductive traces having an upper face;
   a plurality of transducer elements, each of the transducer elements having (a) a core of piezoelectric material and (b) a conductive coating disposed beneath the core, the conductive coating having a lower face; and
   a matching layer disposed on top of the transducer elements,
   wherein the lower face of each of the transducer elements is bonded directly to the upper face of a respective one of the plurality of conductive traces, and
   wherein the layer of insulating material is substantially flat.

2. The transducer of claim 1, wherein the lower face of each of the transducer elements is bonded directly to an upper face of a respective one of the plurality of conductive traces using an insulating adhesive.

3. The transducer of claim 1, wherein the lower face of each of the transducer elements is bonded directly to an upper face of a respective one of the plurality of conductive traces using a conductive adhesive.

4. The transducer of claim 1, wherein the lower face of each of the transducer elements is bonded directly to an upper face of a respective one of the plurality of conductive traces by soldering.

5. The transducer of claim 1, wherein the piezoelectric material comprises PZT.

6. The transducer of claim 1, wherein the plurality of transducer elements comprises at least 20 transducer elements, the plurality of conductive traces comprises at least 20 conductive traces, the transducer elements are spaced at a pitch between 100 and 200 µm, and the transducer elements are between 150 and 400 µm thick.

7. The transducer of claim 6, wherein the lower face of each of the transducer elements is bonded directly to an upper face of a respective one of the plurality of conductive traces using an insulating adhesive.

8. The transducer of claim 1, wherein a thickness of the layer of insulating material is below ¼ wavelength at an operating frequency of the transducer, and wherein a thickness of the conductive traces is below ¼ wavelength at the operating frequency.

9. The transducer of claim 1, wherein the layer of insulating material is about 25 µm thick.

10. The transducer of claim 9, wherein the layer of insulating material is polyimide.

11. The transducer of claim 1, wherein the conductive traces are about 17.5 µm thick.

12. The transducer of claim 11, wherein the conductive traces are copper.

13. The transducer of claim 1, wherein the layer of insulating material is polyimide and is about 25 µm thick, and wherein the conductive traces are copper and are about 17.5 µm thick.

* * * * *